United States Patent
Chang et al.

(10) Patent No.: US 8,664,726 B2
(45) Date of Patent: Mar. 4, 2014

(54) ELECTROSTATIC DISCHARGE (ESD) PROTECTION DEVICE, METHOD OF FABRICATING THE DEVICE, AND ELECTRONIC APPARATUS INCLUDING THE DEVICE

(75) Inventors: Dong-ryul Chang, Suwon-si (KR); Oh-kyunm Kwon, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 302 days.

(21) Appl. No.: 13/041,693

(22) Filed: Mar. 7, 2011

(65) Prior Publication Data

US 2012/0043643 A1    Feb. 23, 2012

(30) Foreign Application Priority Data

Aug. 19, 2010 (KR) .................. 10-2010-0080408

(51) Int. Cl.
*H01L 23/62* (2006.01)

(52) U.S. Cl.
USPC ........................... 257/362; 257/355; 257/356

(58) Field of Classification Search
USPC .................. 257/E29.237, 355–363
See application file for complete search history.

(56) References Cited

U.S. PATENT DOCUMENTS

| | | | | |
|---|---|---|---|---|
| 5,181,091 A * | 1/1993 | Harrington et al. | ........... | 257/355 |
| 6,800,906 B2 * | 10/2004 | Cheng | ........... | 257/355 |
| 7,067,884 B2 * | 6/2006 | Okushima | ........... | 257/355 |
| 7,663,190 B2 * | 2/2010 | Vinson | ........... | 257/355 |
| 7,847,317 B2 * | 12/2010 | Maloney et al. | ........... | 257/173 |
| 8,232,625 B2 * | 7/2012 | Voldman | ........... | 257/621 |
| 8,304,807 B2 * | 11/2012 | Maloney et al. | ........... | 257/173 |
| 8,304,838 B1 * | 11/2012 | Chen et al. | ........... | 257/370 |

* cited by examiner

*Primary Examiner* — Ori Nadav
(74) *Attorney, Agent, or Firm* — Volentine & Whitt, PLLC

(57) ABSTRACT

An electrostatic discharge (ESD) device includes a substrate, an external well of a first conductivity type in the substrate, and an internal well of a second conductivity type in the external well, the first conductivity type opposite the second conductivity type. The ESD device further includes a first heavily doped region of the first conductivity type located at a surface of the internal well, a second heavily doped region of the second conductivity type located at a surface of the internal well, and a third heavily doped region of the first conductivity type located at a surface of the external well. The second heavily doped region is interposed between and spaced from each of the first and third heavily doped regions, and at least one of a space between the first and second heavily doped regions and a space between the second and third heavily doped regions is devoid of a device isolation structure of electrical isolation material.

19 Claims, 12 Drawing Sheets

ELECTROSTATIC DISCHARGE (ESD) PROTECTION DEVICE, METHOD OF FABRICATING THE DEVICE, AND ELECTRONIC APPARATUS INCLUDING THE DEVICE

PRIORITY STATEMENT

A claim of priority is made to Korean Patent Application No. 10-2010-0080408, filed on Aug. 19, 2010, in the Korean Intellectual Property Office.

BACKGROUND

The inventive concepts generally relate to electronic devices, such as semiconductor devices. More particularly, the inventive concepts relate to electrostatic discharge (ESD) protection devices and to methods of fabricating the same.

Electrostatic discharge (ESD) can result from a variety of factors, such as exposure to an electrostatic field or direct contact with an item carrying electrostatic charge. ESD can be particularly damaging to electronic devices, such as semiconductor devices. For example, when a semiconductor device including metal oxide semiconductor (MOS) transistors experiences electrostatic discharge (ESD), the device may be subjected to an instantaneous voltage of 3000V or more, thus damaging a gate insulating layer of the MOS transistors. The resultant partial or complete breakdown of the gate insulating layer can adversely impact the reliability and/or operability of the semiconductor device.

An ESD protection circuit may be utilized in an attempt to prevent ESD-related damage. For example, an ESD protection circuit may be incorporated in a semiconductor device to avoid breakdowns in gate insulating layers resulting from ESD. Generally, ESD protection characteristics are improved as the size of the ESD protection circuit is increased. However, large ESD protection circuits run counter to the industry trend of increased circuit integration and decreased chip size.

SUMMARY

According to an aspect of the inventive concepts, an electrostatic discharge (ESD) device is provided which includes a substrate, an external well of a first conductivity type in the substrate, and an internal well of a second conductivity type in the external well, the first conductivity type opposite the second conductivity type. The ESD device further includes a first heavily doped region of the first conductivity type located at a surface of the internal well, a second heavily doped region of the second conductivity type located at a surface of the internal well, and a third heavily doped region of the first conductivity type located at a surface of the external well. The second heavily doped region is interposed between and spaced from each of the first and third heavily doped regions, and at least one of a space between the first and second heavily doped regions and a space between the second and third heavily doped regions is devoid of a device isolation structure of electrical isolation material.

According to another aspect of the inventive concepts, an electronic apparatus is provided which includes a substrate including a device region and an electrostatic discharge (ESD) region, a pad of electrically conductive material constituting a terminal, and an electrical device disposed at the device region of the substrate and including a signal line connected to the pad. The electronic apparatus further includes an external well of a first conductivity type in the ESD region of the substrate, an internal well of a second conductivity type in the external well, the first conductivity type opposite the second conductivity type, a first heavily doped region of the first conductivity type located at a surface of the internal well, a second heavily doped region of the second conductivity type located at a surface of the internal well, and a third heavily doped region of the first conductivity type located at a surface of the external well. The second heavily doped region is interposed between and spaced from each of the first and third heavily doped regions, at least one of a space between the first and second heavily doped regions and a space between the second and third heavily doped regions is devoid of a device isolation structure of electrical isolation material, and the first and third heavily doped regions are connected to the pad.

According to yet another aspect of the inventive concepts, an electrostatic discharge (ESD) device is provided which includes a substrate, a first external well of a first conductivity type in the substrate, a first internal well of a second conductivity type in the first external well, the first conductivity type opposite the second conductivity type, a second external well of the second conductivity type in the substrate, and a second internal well of the first conductivity type in the second external well. The ESD device further includes a first heavily doped region of the first conductivity type located at a surface of the first internal well, a second heavily doped region of the second conductivity type located at a surface of the first internal well, a third heavily doped region of the first conductivity type located at a surface of the first external well, a fourth heavily doped region of the second conductivity type located at a surface of the second internal well, a fifth heavily doped region of the first conductivity type located at a surface of the second internal well, and a sixth heavily doped region of the second conductivity type located at a surface of the second external well. The second heavily doped region is interposed between and spaced from each of the first and third heavily doped regions, and the fifth heavily doped region is interposed between and spaced from each of the fourth and sixth heavily doped regions. At least one of a space between the first and second heavily doped regions and the space between the second and third heavily doped regions is devoid of a device isolation structure of electrical isolation material, and at least one of a space between the fourth and fifth heavily doped regions and the space between the fifth and sixth heavily doped regions is devoid of a device isolation structure of electrical isolation material.

According to still another aspect of the inventive concepts, a method of fabricating an electrostatic discharge (ESD) device is provided which includes providing a substrate, and forming a double well in the substrate, where the double well includes an external well of a first conductivity type, and an internal well of a second conductivity type in the external well, the first conductivity type opposite the second conductivity type. The method further includes forming a first heavily doped region of the first conductivity type at a surface of the internal well, forming a second heavily doped region of the second conductivity type at a surface of the internal well, and forming a third heavily doped region of the first conductivity type located at a surface of the external well. The second heavily doped region is formed between and spaced from each of the first and third heavily doped regions, and no device isolation structure of electrical isolation material is formed in at least one of the space between the first and second heavily doped regions and in the space between the second and third heavily doped regions.

BRIEF DESCRIPTION OF THE DRAWINGS

The above and other aspects and features of the inventive concepts will become readily apparent from the detailed description that follows, with reference to the accompanying drawings, in which.

DETAILED DESCRIPTION OF EMBODIMENTS

Figure 1:
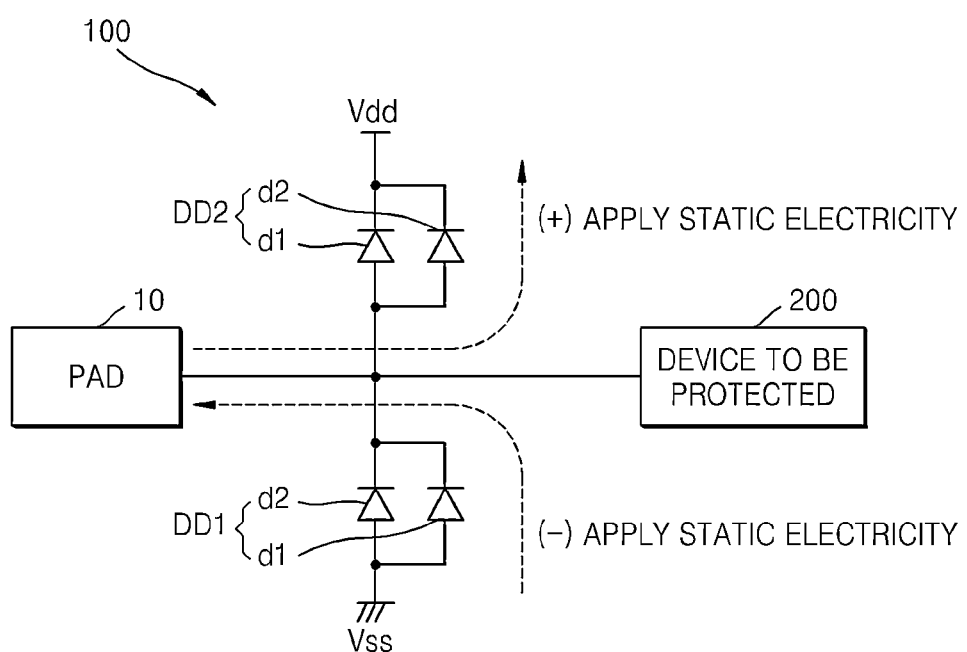
FIG. 1 is an equivalent circuit diagram for use in describing an embodiment of an electrostatic discharge (ESD) protection device in accordance with the inventive concepts.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, if an element or layer is referred to as being "directly on" or "directly connected to" another element or layer, there are no intervening elements or layers present.

It will be understood that although the terms first, second, third etc. are used herein to describe various elements, regions, layers, etc., these elements, regions, and/or layers are not limited by these terms. These terms are only used to distinguish one element, layer or region from another.

Other terminology used herein for the purpose of describing particular examples or embodiments of the inventive concept is to be taken in context and according to what is well known or understood in the art. For example, the terms "comprises" or "comprising" when used in this specification specifies the presence of stated features or processes but does not preclude the presence or additional features or processes.

The term "heavily doped region" as used herein refers to a region in which the dopant (impurity atoms) is present on the order of at least $1.0E14$ atoms/cm$^3$ within the region.

An equivalent circuit diagram of an example of an electronic apparatus that includes an electrostatic discharge (ESD) protection device 100 according to an embodiment of the inventive concepts will now be described with reference to FIG. 1. The apparatus of this example is an integrated circuit (IC) chip which includes a pad 10 for external connection and an electrical device 200 to be protected. The device 200 is electrically connected to the pad 10.

The ESD protection device 100 of this example includes at least a pair of double diodes (DD1 and DD2). Although a single pair of double diodes (DDs) is illustrated in FIG. 1, the ESD protection device 100 may include multiple pairs of double diodes. For example, the apparatus (e.g., IC chip) may include a plurality of devices to be protected. In this case, another pair of DDs may be separately installed in the case in which one pair of DDs provide insufficient protection for the additional device(s) to be protected, or in the case where the layout makes it difficult to connect a single pair of DDs to all of the additional device(s) to be protected.

As shown in FIG. 1, each DD of the embodiment is configured by two diodes d1 and d2 connected to each other in parallel. In particular, the first DD1 includes diodes d1 and d2 each having an anode terminal connected to a ground voltage Vss, and a cathode terminal connected to the pad 10. The second DD2 includes diodes d1 and d2 each having an anode terminal connected to the pad 10, and a cathode terminal connected to a power supply voltage Vdd. That is, the pad 10 is connected to the cathode terminals of the first DD1 and to the anode terminals of the second DD2, and also to the device 200. The pad 10 may, for example, be a via through which an input and output (I/O) signal voltage is applied to the device 200 to be protected.

In the circuit of this embodiment, the diodes of each of the DDs are shown side by side as disposed in parallel. However, each DD may have a vertical structure in a substrate, as will be described in detail below with reference to FIGS. 2, 3 and 9.

The ESD protection device 100 having the above-described structure protects the device 200 from an abrupt discharge of static electricity, i.e., ESD, as will be described below. Specifically, positive static charges discharge in the forward direction of the second DD (DD2), i.e., to a terminal to which the power supply voltage Vdd is applied. Negative static charges discharge in the forward direction of the first DD (DD1), i.e., to the pad 10. (The directions of current flow of the positive and negative charges of static electricity are represented by the dashed arrows appearing in FIG. 1.) Thus, the protection of the device 200 is achieved by the formation of an ESD discharge path between a pad (namely, pad 10) and the ground voltage terminal and/or between the pad and the power supply voltage terminal.

The device 200 may be any type of electrical device. For example, the device 200 may correspond to various types of memory devices such as a dynamic random access memory (DRAM), a flash memory, a logic device constituting controllers, an interface for data communications, or the like. Thus, the device 200 may include a memory circuit, a control circuit, and/or a peripheral circuit of an IC chip. The device 200 may also include a metal oxide semiconductor (MOS) transistor which is highly susceptible to ESD damage. However, the inventive concepts are not limited by the type of component(s) constituted by the device 200.

As mentioned above, the electronic apparatus of the current embodiment includes the ESD protection device 100. Thus, static charges dissipate through the ESD protection device 100 of the electronic apparatus and thus the device 200 is protected from an abrupt discharge of static electricity. Although not shown in FIG. 1, a resistor or resistive circuit may be installed at the input/output of the device 200 to further protect the device 200 from static electricity.

An example of a layout of an ESD protection device including a DD according to an embodiment of the inventive concepts will now be described with reference to FIGS. 2 and 3.

Figure 2:
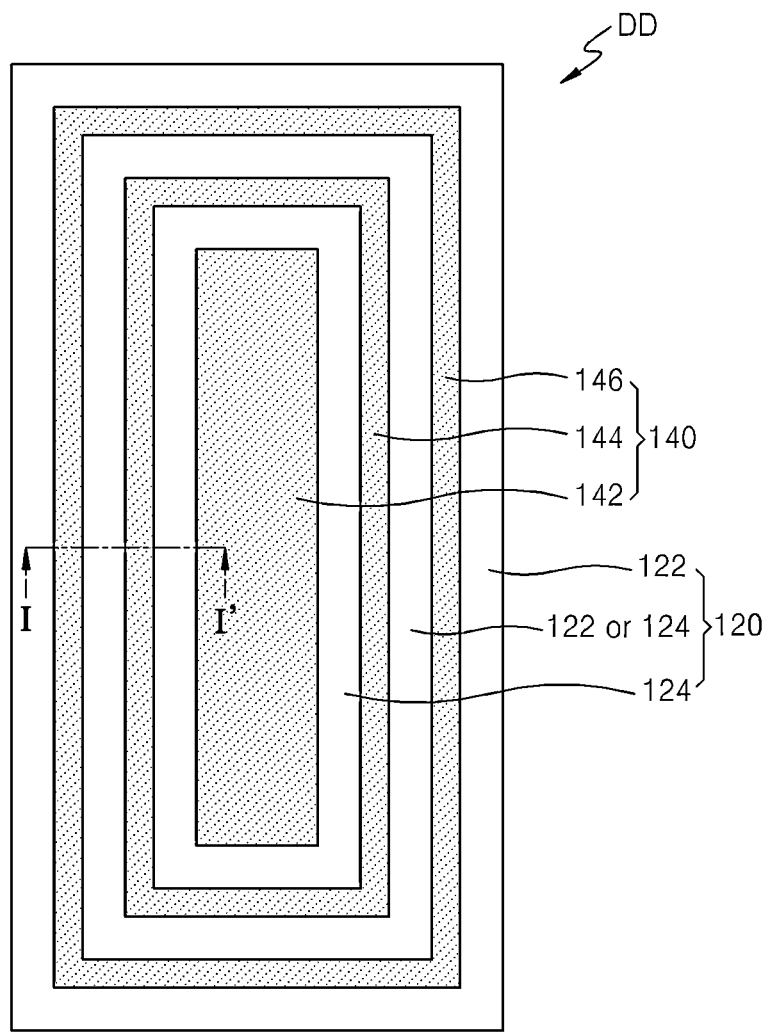
FIG. 2 illustrates the layout of an embodiment of an ESD protection device according to the inventive concepts.
Figure 3:
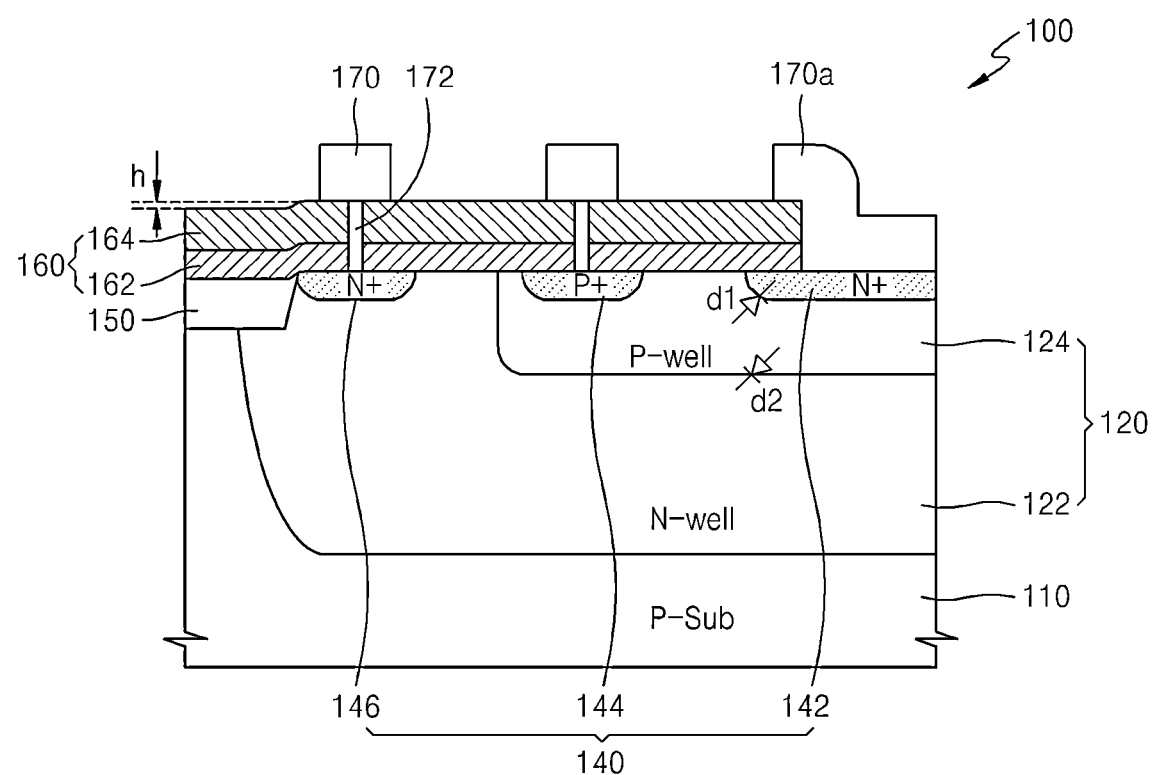
FIG. 3 is a cross-sectional view taken along line I-I of the ESD protection device illustrated in FIG. 2.

Referring mainly to FIG. 2, the DD of the ESD protection device is laid out as a heavily-doped region 140 and a double well 120 of a substrate (110 in FIG. 3). The double well 120, as the name implies, includes two wells, namely, an N-type well 122 and a P-type well 124. The P-type well is formed in the N-type well 122. The double well 120 will be described in more detail later with reference to FIG. 3. The heavily-doped region 140 includes respective first, second and third heavily doped regions 142, 144 and 146, namely, an internal N+ type heavily-doped region 142 and an internal P+ type heavily-doped region 144 which are formed in the P-type well 124, and an external N+ type heavily-doped region 146 which is formed in the N-type well 122. Here, the internal N+ type heavily-doped region 142 and the P-type well 124 may be regarded as constituting a junction region because they are of different conductivity types. Such a P+ type or N+ type heavily-doped region may be referred to as a P+ type or N+ type high density active region.

The N+ type heavily-doped region 142 is formed in an upper part of a central portion of the P-type well 124 and has an elongated shape as viewed in plane coincident with a surface of the substrate. However, the embodiment is not limited to the rectangular shape shown in FIG. 2, and the planar shape of the N+ type heavily-doped region 142 may instead, for example, be elliptical, square, circular, and so on. The internal P+ type heavily-doped region 144 is disposed in an upper part of a boundary between sections of the double well 120, e.g., between the N-type well 122 and the P-type well 124, and encloses the internal N+ type heavily-doped region 142. The external N+ type heavily-doped region 146 is formed in an upper part of the N– type well 122 and encloses the internal N+ type heavily-doped region 142 and the internal P+ type heavily-doped region 144. The external N+ type heavily-doped region 146 may be regarded as enclosing an upper part of the P– type well 124.

However, the inventive concepts are not limited to the above-described structure of the heavily-doped region 140. In other words, the layout of the DD may include various other forms and configurations of a heavily-doped region.

Furthermore, in the example of this embodiment, the width of the internal N+ type heavily-doped region 142 is at least two times greater than the width of the internal P+ type heavily-doped region 144 or the external N+ type heavily-doped region 146. However, the DD is not limited to heavily doped regions having such relative widths. In other words, for example, the width of the internal N+ type heavily-doped region 142 may be less than two times the width of the internal P+ type heavily-doped region 144.

Referring now to FIG. 3, the substrate 110 may be a P– type substrate. The double well 120 is formed in an upper region of the substrate 110.

The heavily-doped region 140 is formed in an upper portion of the double well 20. Specifically, in this example of the present embodiment, the internal N+ type heavily-doped region 142 and the internal P+ type heavily-doped region 144 are formed in an upper portion of the P– type well 124. On the other hand, the external N+ type heavily-doped region 146 is formed in an upper portion of the N– type well 122. Here, the internal N+ type heavily-doped region 142 forms a junction region with the P– type well 124, as was mentioned above.

As shown in FIG. 3, no device isolation structure is formed between the internal N+ type heavily-doped region 142 and the internal P+ type heavily-doped region 144, and no device isolation structure is formed between the internal P+ type heavily-doped region 144 and the external N+ type heavily-doped region 146. In other words, no device isolation structure is formed in the double well 120. However, a device isolation structure 150 may be formed at the boundary of the double well 120 to isolate the double well 120 from a peripheral device. In particular, the device isolation structure 150 of this example is located at the boundary between the external well and the portion of the substrate outside the double well, i.e., outside the external well 122. The device isolation structure 150 may, for example, be a shallow trench isolation (STI) structure or a local oxidation of silicon (LOCOS) structure.

Thus, as is also shown in FIG. 3, the internal N+ type heavily-doped region 142 and the P– type well 124 form a first diode d1 in which the internal N+ type heavily-doped region 142 is disposed in the forward direction of the diode. Also, the P– type well 124 and the N– type well 122 form a second diode d2 in which the N– type well 122 is disposed in the forward direction of that diode. Therefore, a DD structure is formed in which two diodes having opposite forward directions are connected to each other in series in a vertical direction in the substrate 110.

The ESD protection device 100 of this example also includes a first metal electrode 170a, and second and third metal electrodes 170. The metal electrodes 170a and 170 are disposed on the substrate 110 in which the double well 120, the device isolation structure 150, and the heavily-doped region 140 have been formed. In particular, the metal electrodes 170a and 170 are formed on electrical insulation 160 which is disposed on the substrate 110. In the current embodiment, the electrical insulation 160 is made up of a plurality of layers of insulating materials, e.g., first and second insulating layers 162 and 164, but may consist of a single layer of insulating material. For simplicity, the electrical insulation 160 will be referred to hereinafter merely as insulating layer 160. In the example of this embodiment, the second and third metal electrodes 170 are electrically connected to the heavily-doped regions 144 and 146, respectively, through respective first and second contact plugs 172 which extend through the insulating layer 160. On the other hand, as shown in FIG. 3, the first metal electrode 170a may be directly connected to the heavily-doped region 142.

As previously described, in the example of this embodiment of the ESD protection device 100, no device isolation structure is formed in the double well 120. Thus, the upper surfaces of those portions of the substrate 110 and the insulating layer 160 which are situated on the double well 120 may be flat. On the other hand, when the device isolation structure 150, and in particular, a STI structure is formed, a trench is filled, and the resulting structure is planarized and is wet-etched. The wet etching process removes an upper part of the material filling the trench, i.e., over-etches the material left in the trench at the end of the planarizing process. As a result, the upper surface of the material remaining in the trench is lower than the upper surface of that portion of the substrate surrounding the trench. Therefore, the upper surface of that portion of the insulating layer 160 which is situated on the double well 120 may be disposed at a level that is higher, by a predetermined height "h", than the upper surface of that portion of the insulating layer 160 which is situated on the device isolation structure 150.

The advantage of not providing a device isolation structure in the double well 120 will now be explained with reference to FIGS. 4A and 4B.

Figure 4A:
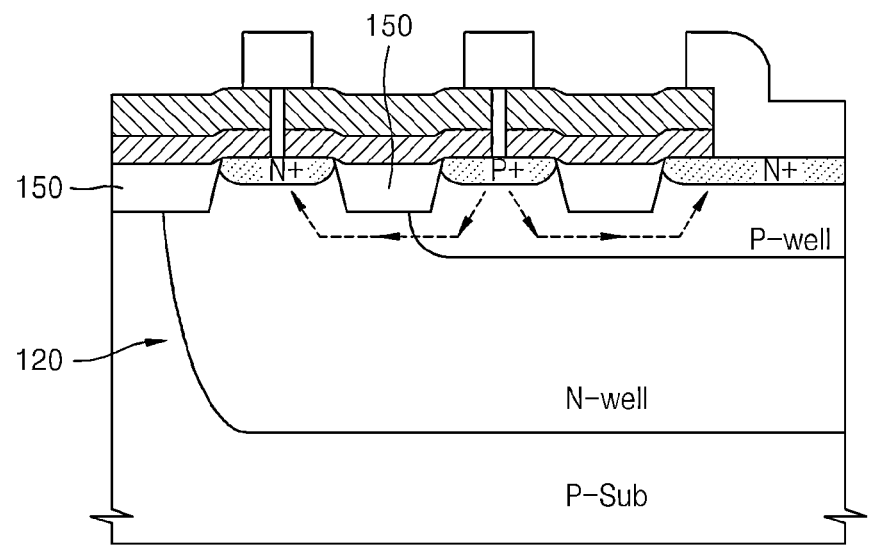
FIGS. 4A and 4B are respective cross-sectional views of an ESD protection device which includes a device isolation structure and an ESD protection device which is devoid of a device isolation structure according to an embodiment of the inventive concepts, for use in comparing the flow of current in the respective devices.
Figure 4B:
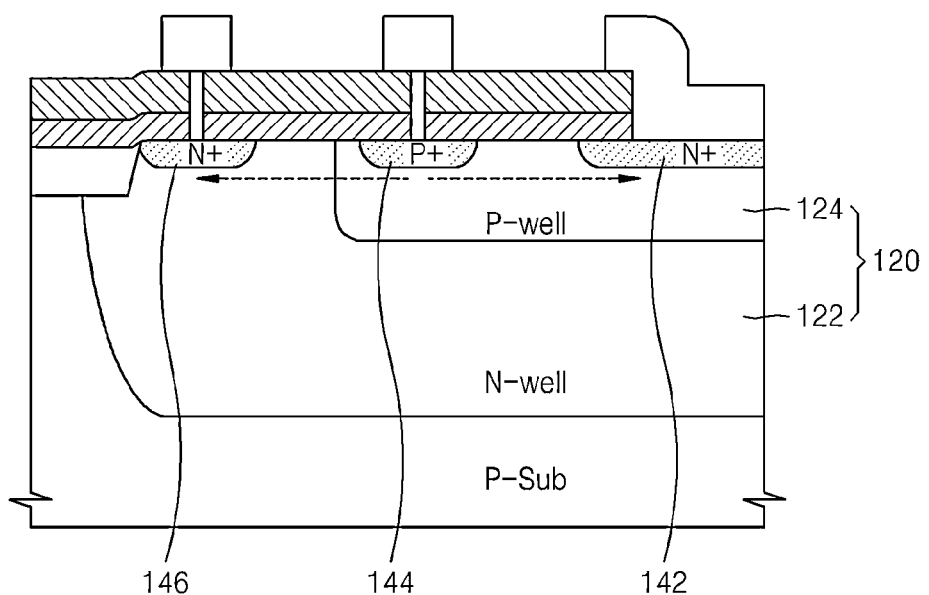

FIG. 4A shows an ESD protection device in which device isolation structure 150, e.g., an STI, is provided in a double well 120 of a DD structure, and FIG. 4B shows an embodiment of an ESD protection device in which the device isolation structure 150 is not provided in a double well 120 of a DD structure. In the case of FIG. 4B, i.e., in the case of an embodiment according to the inventive concepts, the double well 120 is deemed to be devoid of device isolation because a device isolation structure is not encompassed or surrounded by the double well 120. In particular, according to an aspect of the inventive concepts, device isolation is not present between the internal N+ type heavily-doped region 142 and the internal P+ type heavily-doped region 144 and/or device isolation is not present between the internal P+ type heavily-doped region 144 and the external N+ type heavily-doped region 146.

For reference, the dashed arrows in FIGS. 4A and 4B indicate directions in which current flows when a high voltage is applied to the internal P+ type heavily-doped region and a low voltage is applied to the internal N+ type heavily-doped region and the external N+ type heavily-doped region. Obviously, if voltages were applied in an opposite way, the directions of the current flow would be opposite to those shown in the figure.

As shown in FIG. 4A, if the ESD protection device were to include device isolation structure in the double well 120, the current flows along a relatively long path between the internal P+ type heavily-doped region and an N+ type heavily-doped region, and the current is concentrated at the P+ type heavily-doped region, thereby causing a bottleneck phenomenon at the internal P+ type heavily-doped region where, as a result, a large amount of heat is generated. That is, the resistance to current flow from the P+ type heavily-doped region is so high that the resulting heat may melt that part of the structure where the P+ type heavily-doped region is connected to a contact. Thus, the ESD protection device shown in FIG. 4A will exhibit a large parasitic resistance which lowers the ability of the device to protect against ESD. Furthermore, this bottleneck phenomenon would make it difficult to scale down the device, i.e., any attempt to scale down such a device would exacerbate the bottleneck phenomenon and all of the resulting problems described above.

In contrast, as shown in FIG. 4B, the ESD protection device 100 of the current embodiment does not include device isolation in the double well 120, and thus the path along which current flows is relatively short and a bottleneck phenomenon does not occur. Therefore, any parasitic resistance exhibited by the ESD protection device 100 is insignificant, and the ESD protection device 100 has a enhanced ability to protect against ESD.

Figure 5B:
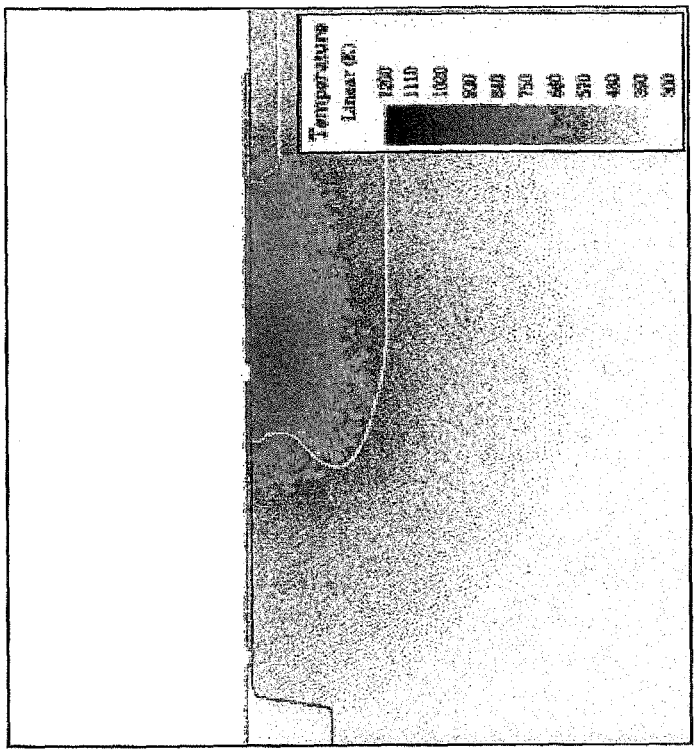
FIGS. 5A and 5B are respective illustrations of simulated heat generated by the application of ESD machine model (MM) pulses to an ESD protection device which includes a device isolation structure in its double well, and simulated heat generated by application of ESD MM pulses to the ESD protection device which is devoid of such a device isolation structure according to an embodiment of the inventive concepts.
Figure 5A:
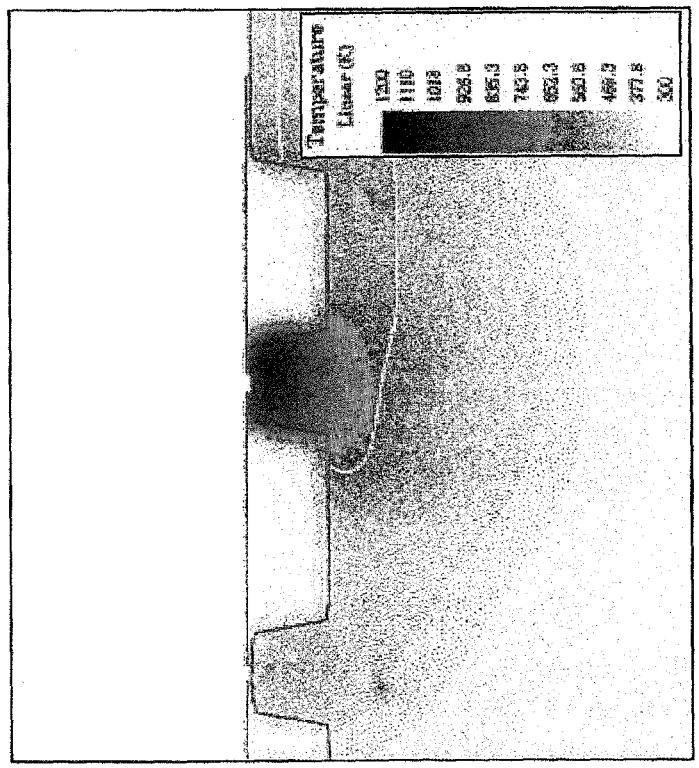

FIGS. 5A and 5B are representative of heat generated in an ESD protection device including device isolation structure in the double well (FIG. 5A) and the heat generated in an ESD protection device devoid of device isolation structure in the double well according to an embodiment of the inventive concepts (FIG. 5B), when ESD machine model (MM) pulses are applied to the ESD protection devices.

The results of the simulation shown in FIG. 5A illustrate a relatively large amount of heat generated at the internal P+ type heavily-doped region due to the above-described bottleneck phenomenon. Evaluated in the context of a real electronic product, the P+ type heavily-doped region would be physically damaged due to this amount of heat. This physical damage would manifest itself in the form of the melting of that region of the device where the P+ type heavily-doped region is connected to an electrical contact.

On the other hand, referring to FIG. 5B showing the results of the same simulation applied to an ESD protection device according to an embodiment of the inventive concepts, hardly any heat is generated in the internal P+ type heavily-doped region.

Figure 6:
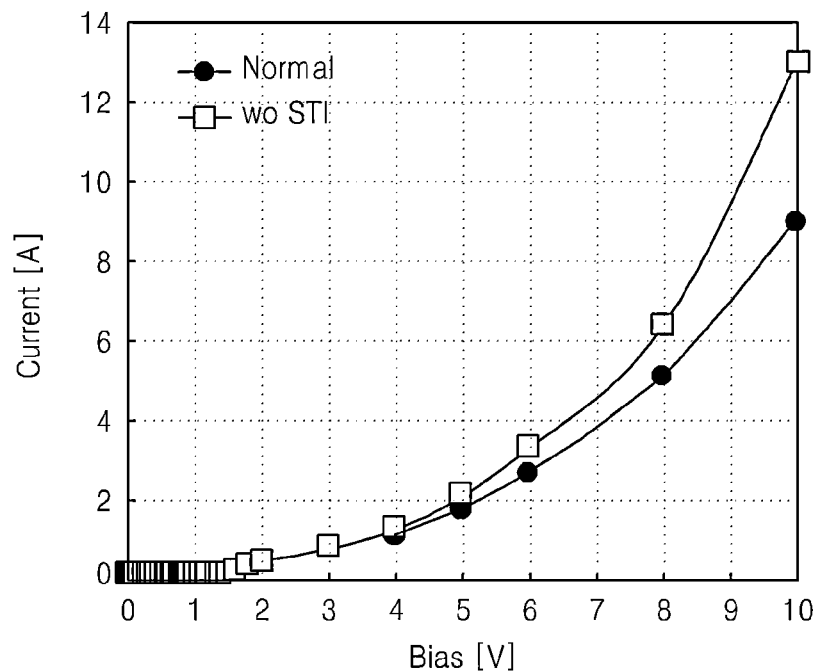
FIG. 6 is a graph of a forward current characteristic of a diode of an ESD protection device which includes a device isolation structure in its double well, and of a forward current characteristic of a diode of the ESD protection device which is devoid of such a device isolation structure according to an embodiment of the inventive concepts.

FIG. 6 is a graph of a forward current characteristic ("Normal") of a diode of an ESD protection device including device isolation structure in the double well, and a forward current characteristic ("wo STI") of a diode of an ESD protection device according to an embodiment of the inventive concepts in which the double well is devoid of device isolation structure.

Referring to FIG. 6, the forward current characteristic with respect to a bias voltage V is considerably higher in an embodiment of the ESD protection device according to the inventive concepts than in a corresponding ESD protection device having device isolation structure in the double well. For example, if a bias voltage of about 10V is applied, forward current flowing in the ESD protection device according to an embodiment of the inventive concepts is about 4 A higher than the ESD protection device having device isolation structure in the double well.

The higher the forward current characteristic of a device, the lower the parasitic resistance exhibited by the device. As mentioned above, low parasitic resistance means that the ESD protection device has a correspondingly high ability to protect against ESD. Thus, an ESD protection device according to an embodiment of the inventive concepts lends itself to being scaled down so that a small yet effective ESD protection device can be realized.

Figure 7:
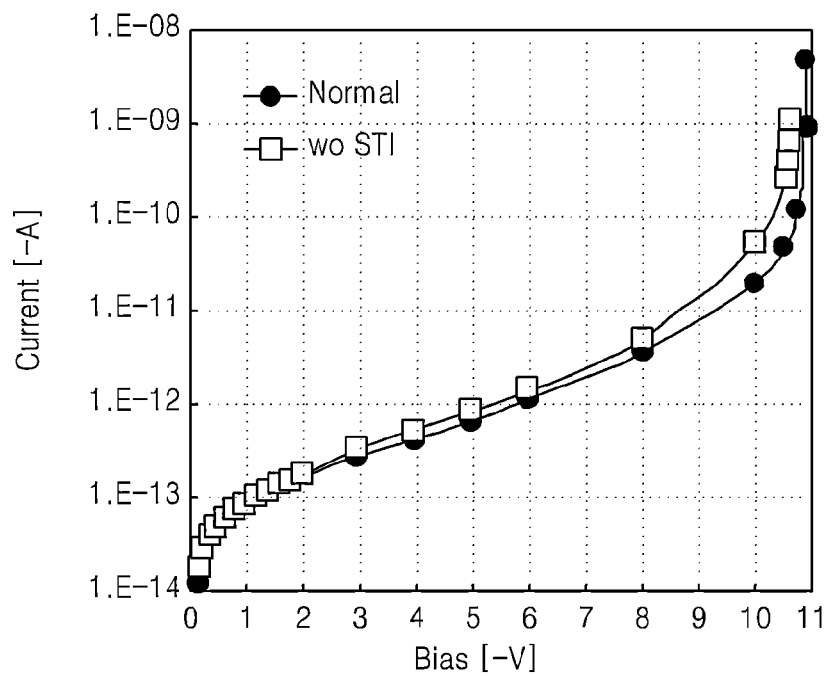
FIG. 7 is a graph of a reverse current characteristic of a diode of an ESD protection device which includes a device isolation structure in its double well, and a reverse current characteristic of a diode of the ESD protection device which is devoid of such a device isolation structure according to an embodiment of the inventive concepts.

FIG. 7 is a graph of a reverse current characteristic ("Normal") of a diode of an ESD protection device including device isolation structure in the double well, and a reverse current characteristic ("wo STI") of a diode of an ESD protection device according to an embodiment of the inventive concepts in which the double well is devoid of device isolation structure.

Referring to FIG. 7, the reverse current characteristic with respect to a reverse bias voltage −V is nearly equal in an embodiment of the ESD protection device (FIG. 4B) according to an embodiment of the inventive concepts and in a corresponding ESD protection device (FIG. 4A) having device isolation structure in the double well. In other words, an ESD protection device in which the double well is devoid of device isolation according to an embodiment of the inventive concepts shows the same reverse current characteristic as a similar ESD protection device having device isolation structure in the double well. This means that an ESD protection device according to an embodiment of the inventive concepts is as impervious to an unexpected reverse bias voltage as a corresponding ESD protection device having device isolation structure in the double well.

Figure 8:
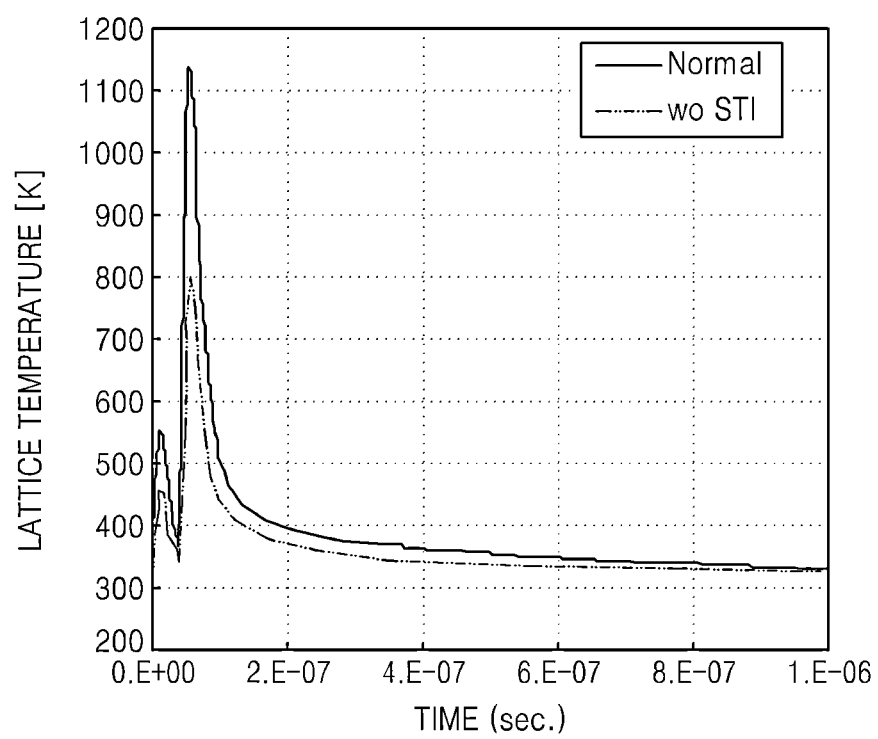
FIG. 8 is a graph of a lattice temperature characteristic of an ESD protection device which includes a device isolation structure in its double well, and a lattice temperature characteristic of the ESD protection device which is devoid of such a device isolation structure according to an embodiment of the inventive concepts.

FIG. 8 is a graph of a lattice temperature characteristic ("Normal") of a diode of an ESD protection device including device isolation structure in the double well, and a lattice temperature characteristic ("wo STI") of a diode of an embodiment of an ESD protection device according to the inventive concepts. More specifically, FIG. 8 illustrates lattice temperatures of the internal P+ type heavily-doped region of an ESD protection device having device isolation structure in the double well (FIG. 4A), and lattice temperatures of the internal P+ type heavily-doped region of an ESD protection device according to an embodiment of the inventive concepts (FIG. 4B). Here, lattice temperature refers to the temperature in a lattice of material constituting the internal P+ type heavily-doped region. In the examples used to graph the lattice temperature characteristics in FIG. 8, the internal P+ type heavily-doped regions were of a silicon-based material.

As shown in FIG. 8, the maximum temperature generated in the ESD protection device according to an embodiment of the inventive concepts is about 350K lower than that generated in the ESD protection device having the device isolation structure in the double well. Also, the temperature in the ESD protection device according to an embodiment of the inventive concepts decreases at a slightly higher rate than the temperature in the ESD protection device having the device isolation structure in the double well. The reason for this is that the silicon-based material of the internal P+ type heavily-doped region is more thermally conductive, i.e. has a higher heat transfer coefficient, than the oxide of the device isolation structure. Thus, heat is conducted at a higher rate from the region of the double well of the ESD protection device, which consists mainly of silicon, according to an embodiment of the inventive concepts than from the region of the double well of the ESD protection device having an oxide device isolation structure in the double well.

An embodiment of an ESD protection device including a pair of DDs, will now be described with reference to FIG. 9. It is noted, however, that the inventive concepts are not limited to devices having a single pair of DDs. That is, the inventive concepts encompass ESD protection devices having multiple pairs of DDs.

A first of the DDs (DD1) has the same structure as the DD illustrated in FIG. 3, and thus it will not be described in further detail to avoid redundancy in the description.

A second of the DDs (DD2) has a structure similar to the first DD (DD1). However, the conductivity type of the double well 120a of the second DD (DD2) is different from that of the double well 120 of the first DD (DD1), and the conductivity type of the heavily-doped region 140a of the second DD (DD2) formed in an upper portion of the double well 120a is different from that of the heavily-doped region 140 of the first DD (DD1). Thus, the second DD (DD2) has a structure in which an internal N-type well 124a is formed in an external P-type well 122a, and the conductivity type of the portions of the heavily-doped region 140a formed in an upper portion of the double well 120a are all opposite to those of the heavily-doped region 140 formed in the upper portion of the double well 120. Accordingly, an internal P+ type heavily-doped region 142a and an internal N+ type heavily-doped region 144a are formed in the internal N-type well 124a, and an external P+ type heavily-doped region 146a is formed in an upper part of the external P− type well 122a.

The directions of the diodes of the second DD (DD2) are opposite to the directions of the diodes of the first DD DD1. In other words, a third diode d3 is formed at the junction of the internal P+ type heavily-doped region 142a and the internal N-type well 124a and the forward direction of the third diode d3 is toward the internal N-type well 124a, and a fourth diode d4 is formed at the junction of the internal N-type well 124a and the external P+ type well 122a and the forward direction of the fourth diode d4 is toward the external P+ type well 122a.

Also, in the first DD (DD1), the P+ type heavily-doped region 144 in the P− type well 124 is connected to a ground voltage Vss through metal electrodes 170. The N+ type heavily-doped region 142 in the P-type well 124 and the N+ type heavily-doped region 146 in the N-type well 122 are connected to a pad to which an I/O signal voltage is applied, through metal electrodes 170a and 170, respectively.

In the second DD (DD2), the N+ type heavily-doped region 144a in the internal N-type well 124a is connected to a power supply voltage Vdd through metal electrodes 170. Also, the P+ type heavily-doped region 142a in the internal N-type well 124a and the P+ type heavily-doped region 146a in the external P− type well 122a are connected to the pad through metal electrodes 170 and 170a, respectively.

Figure 9:
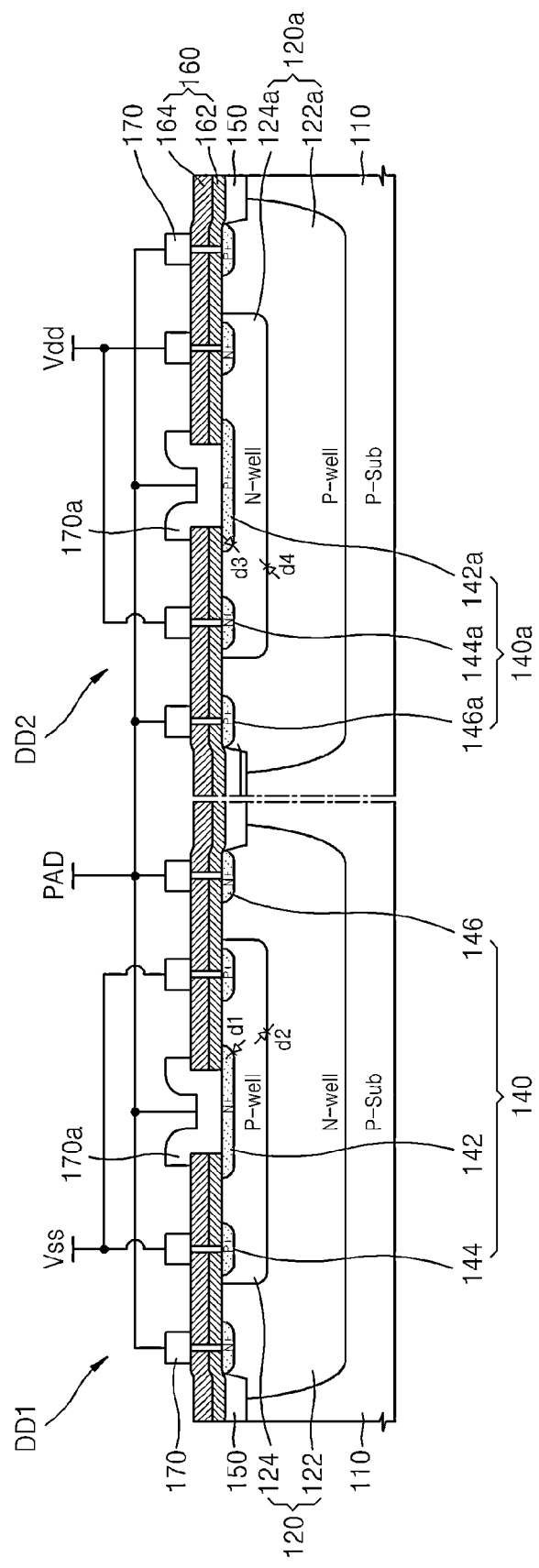
FIG. 9 is a cross-sectional view of an embodiment of an ESD protection device including at least two double-diodes according to an embodiment of the inventive concepts.

The ESD protection device of FIG. 9 is equivalent to the circuit diagram of FIG. 1 based on the above-described connection relations. For example, if negative static charges are applied to the pad 10, current flows as illustrated in FIG. 4B in the first DD (DD1). If positive static charges are applied to the pad, current flows from a P+ type heavily-doped region, i.e., from the pad 10, to an N+ type heavily-doped region, i.e., toward the power supply voltage Vdd, in the second DD (DD2).

An electronic apparatus including an ESD protection device and a device to be protected, according to an embodiment of the inventive concepts, will now be described with reference to FIG. 10.

The ESD protection device 100 of this embodiment has the same structure as that illustrated with reference to FIG. 9, but only the first DD (DD1) is illustrated for simplicity. Furthermore, the ESD protection device 100 will not be described again in detail for the sake of brevity.

The device 200 to be protected is formed with the ESD protection device 100 on a substrate 110 and is spaced apart from the ESD protection device 100. As was mentioned previously, the device 200 may be any type of electrical device which is to be protected from ESD. In this example, the device 200 is a complementary metal oxide semiconductor (CMOS) device which is typically found in a memory device such as a DRAM or a flash memory, and in logic devices.

The CMOS will now be described in brief A plurality of N-type wells 230 and a plurality of P-type wells 220 are formed in the substrate 110, and CMOS transistors are respectively formed in the N− type wells 230 and the P− type wells 220. The CMOS transistors include drain regions and source regions 240 formed at the upper portions of the N-type wells 230 and the P-type wells 220, channel regions each extending between a drain region 240 and a source region 240, and gate electrodes 250 formed on the channel regions, respectively. Gate insulating layers 252 are formed between the gate electrodes 250 and the channel regions.

A pad to which an I/O signal voltage is applied is connected to each of the gate electrodes 250 of the CMOS transistors. Also, the pad is connected to the ESD protection device 100 as described above. Therefore, if unexpected static electricity is applied to the pad, the static electricity discharges through the ESD protection device 100, thereby preventing breakdown of the gate insulating layers 252 or junction spiking which could otherwise occur if the static electricity were applied to the gate electrodes 250 of the CMOS transistors.

Figure 10:
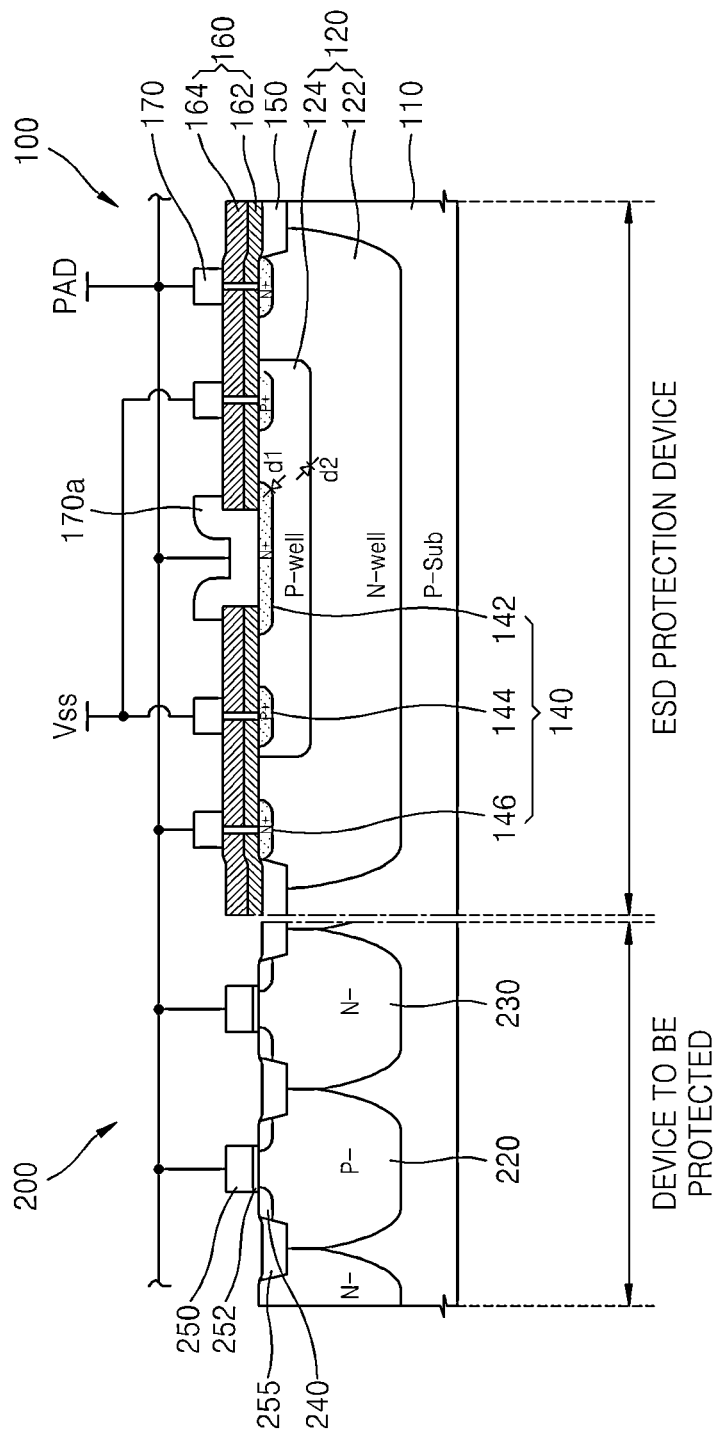
FIG. 10 is a cross-sectional view of an embodiment of an ESD protection device and a device to be protected according to an embodiment of the inventive concepts.

Although FIG. 10 shows the device 200 disposed on the left hand side of the ESD protection device 100, the inventive concepts are not limited to such an arrangement. Rather, the device 200 may be disposed at any part of the substrate 110 relative to the ESD protection device 100.

An embodiment of a method of fabricating an ESD protection device, according to an embodiment of the inventive concepts, will now be described with reference to FIGS. 11 through 16. For this purpose, the fabricating of that part of the ESD protection device of FIG. 9 having the first DD (DD1) will be described.

Figure 11:
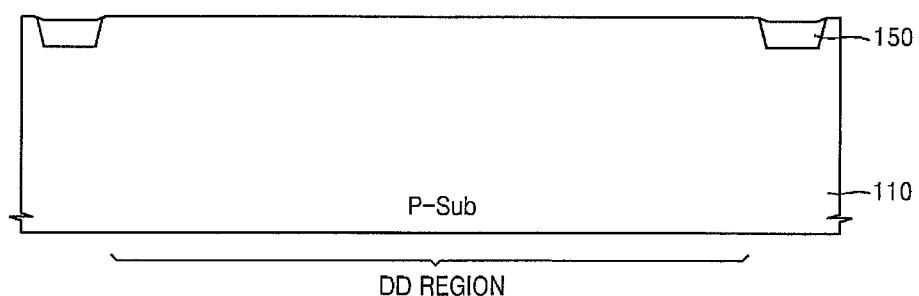
FIGS. 11 through 16 are cross-sectional views illustrating an embodiment of a method of fabricating an ESD protection device according to an embodiment of the inventive concepts.

Referring to FIG. 11, a device isolation structure 150 is formed in a substrate 110, thereby demarcating a DD region. The substrate 110 in this example is a P-type of semiconductor substrate. The device isolation structure 150 may be an STI or a LOCOS structure. Techniques of forming such device isolation structures are very well known in the semiconductor device fabrication art, per se, and were alluded to above in the case of an STI structure. Thus, the forming of the device isolation structure will not be described in further detail.

Figure 12:
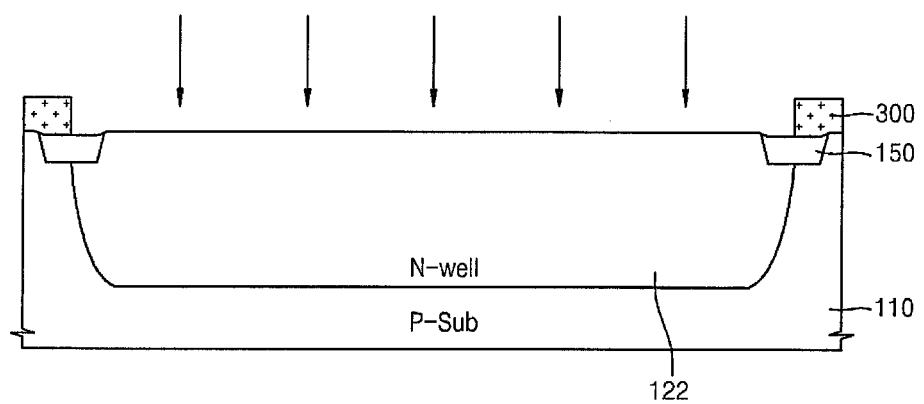

Referring to FIG. 12, an N− type well 122 is formed in the DD region. To this end, a photoresist (PR) pattern 300 is formed on the substrate 110, and then the portion of the substrate 110 exposed by the opening in the PR pattern 300 is doped with N− type ions, e.g., phosphorus.

Figure 13:
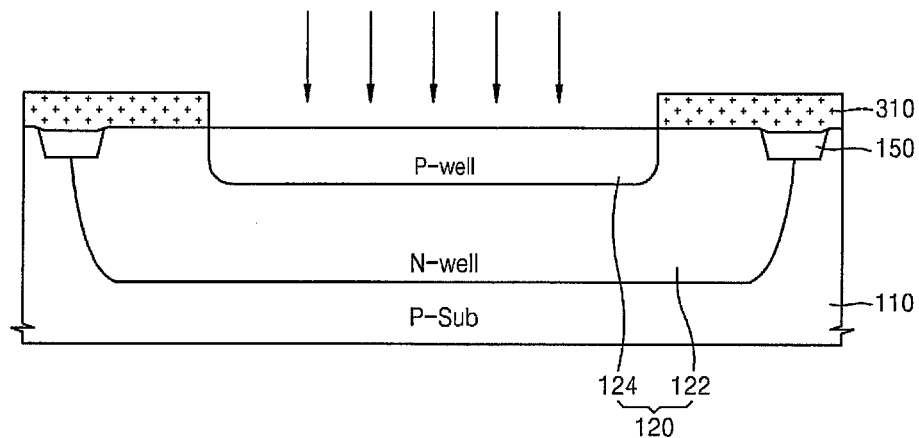

Referring to FIG. 13, after the N− type well 122 is formed, a P− type well 124 is formed in the N− type well 122. To this end, a PR pattern 310 is formed on the substrate 100, and then the portion of the substrate 110 exposed by the opening in the PR pattern 310 is doped with P− type ions, e.g., boron.

Figure 14:
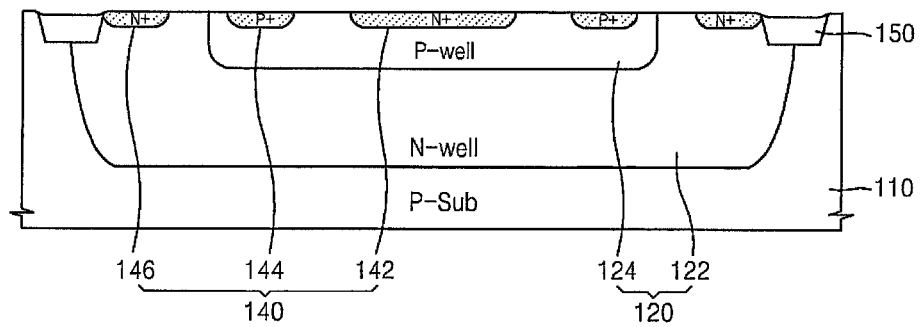

Referring to FIG. 14, an internal P+ type heavily-doped region 144 and an internal N+ type heavily-doped region 142 are formed in the P− type well 124, and an external N+ type heavily-doped region 146 is formed in the N− type well 122. The internal P+ type heavily-doped region 144, the internal N+ type heavily-doped region 142, and the external N+ type heavily-doped region 146 may be formed according to the layout illustrated in FIG. 2. In other words, the internal N+ type heavily-doped region 142 may be formed in a central portion of the P− type well 124, the P+ type heavily-doped region 144 may be formed to enclose the internal N+ type heavily-doped region 142, and the external N+ type heavily-doped region 146 may be formed to enclose the internal P+ type heavily-doped region 144.

In this respect, the P+ type heavily-doped region 144 may be formed using an appropriate mask, and then the N+ type heavily-doped regions 142 and 146 may be formed using another mask. The external N+ type heavily-doped region 146 may be formed together with the internal N+ type heavily-doped region 142 as these regions are of the same conductivity type. Alternatively, the N+ type heavily-doped regions 142 and 146 may be formed before the P+ type heavily-doped region 144.

Figure 15:
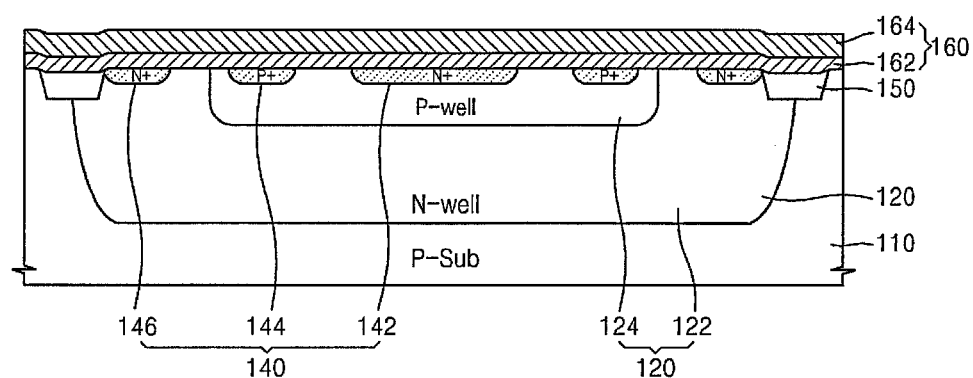

Referring to FIG. 15, electrically insulating material 160 is formed over the entire surface of the substrate 110 on which the N− type well 122, the P− type well 124, and the heavily-doped region 140 have been formed. The insulating material 160 may be an oxide layer such as a layer of silicon oxide or a nitride layer such as a layer of silicon nitride. As shown in FIG. 15, the insulating material 160 may comprise first and second insulating layers 162 and 164. Thus, the electrically insulating material 160 may consist of a single layer of electrically insulating material or a plurality of layers of different electrically insulating materials.

Figure 16:
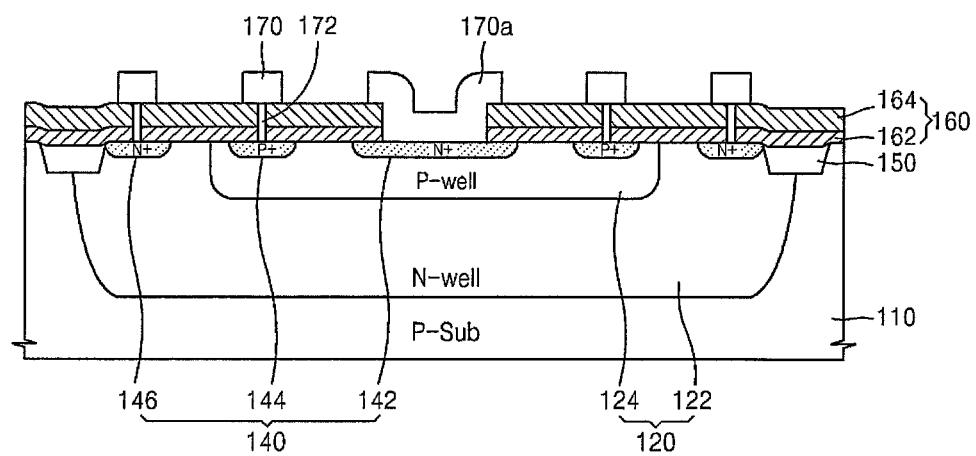

Referring to FIG. 16, metal electrodes 170 and 170a are formed on the insulating layer(s) 160. In this regard, a predetermined part of the insulating layer(s) 160 may be etched to form openings that expose the heavily-doped region 140, contact plugs 172 may be formed in the openings so as to contact the heavily-doped region 140, and then metal electrodes 170 maybe formed on the contact plugs 172. In addition or alternatively, a predetermined part of the insulating layer 160 may be etched to expose the heavily-doped region 140, and then metal electrodes 170a may be formed in the openings so as to contact the heavily-doped region 140. The metal electrodes may be connected to a pad or a ground voltage, as shown in and described with reference to FIG. 9, through a subsequent wiring process.

The process of forming the DD illustrated on the right side of FIG. 9 is substantially the same as the process described above. These processes may be performed together in a manner that will be readily apparent to those skilled in the art. In this respect, as well, the aforementioned wiring process may provide all of the wiring connections shown in FIG. 9. Also, the device 200 illustrated in FIG. 10 may be formed together with the ESD protection device 100.

Finally, embodiments of the inventive concepts have been described above in detail. The inventive concepts may, however, be embodied in many different forms and should not be construed as being limited to the embodiments described above. Rather, these embodiments were described so that this disclosure is thorough and complete, and fully conveys the inventive concepts to those skilled in the art. Thus, the true spirit and scope of the inventive concepts are not limited by the embodiments described above, but are instead defined by the following claims.

What is claimed is:

1. An electronic apparatus comprising:
   a substrate including a device region and an electrostatic discharge (ESD) region;
   a pad of electrically conductive material constituting a terminal;
   an electrical device disposed at the device region of the substrate and including a signal line electrically connected to the pad;
   an external well of a first conductivity type in the (ESD) region of the substrate;
   an internal well of a second conductivity type in the external well, the first conductivity type opposite the second conductivity type;
   a first heavily doped region of the first conductivity type located at a surface of the internal well;
   a second heavily doped region of the second conductivity type located at a surface of the internal well;
   a third heavily doped region of the first conductivity type located at a surface of the external well;

electrically conductive wiring extending from the pad and electrically connecting the first heavily doped region to the pad, and the third heavily doped region to the pad, and wherein the second heavily doped region is interposed between and spaced from each of the first and third heavily doped regions, and wherein at least one of a space between the first and second heavily doped regions and a space between the second and third heavily doped regions is devoid of a device isolation structure of electrical isolation material.

2. The electronic apparatus of claim 1, further comprising a device isolation structure of electrical isolation material located in the substrate between the device region and the ESD region.

3. The electronic apparatus of claim 1, wherein the space between the first and second heavily doped regions and the space between the second and third heavily doped regions are both devoid of electrical isolation material.

4. The electronic apparatus of claim 1, further comprising first, second and third metal electrodes electrically connected to the first, second and third heavily doped regions, respectively.

5. The electronic apparatus of claim 4, wherein the first conductivity type is N-type and the second conductivity type is P-type, the second metal electrode is electrically connected to a ground potential, and the first and third metal electrodes are electrically connected to the pad by the wiring.

6. The electronic apparatus of claim 4, wherein the first conductivity type is P-type and the second conductivity type is N-type, and wherein the second metal electrode is electrically connected to a voltage source, and the first and third metal electrodes are connected to the pad by the wiring.

7. The electronic apparatus of claim 4, further comprising an insulating layer on the substrate, and first and second contact plugs extending through the insulating layer into contact with the second and third heavily doped regions, respectively, and wherein the first metal electrode directly contacts the first heavily doped region, and the second and third metal electrodes are electrically connected to the second and third heavily doped regions via the first and second contact plugs, respectively.

8. The electronic apparatus of claim 1, wherein the internal well is located entirely within the external well.

9. The electronic apparatus of claim 1, wherein the second heavily doped region surrounds the first heavily doped region, and the third heavily doped region surrounds the second heavily doped region.

10. The electronic apparatus of claim 1, further comprising a device isolation structure of electrical isolation material located in the substrate and extending along a boundary between the external well and a portion of the substrate outside the external well.

11. The electronic apparatus of claim 1, wherein the electrical device is a complementary metal oxide CMOS device.

12. An electronic apparatus comprising:
a substrate including a device region and an electrostatic discharge (ESD) region;
a pad of electrically conductive material constituting a terminal;
an electrical device disposed at the device region of the substrate and including a signal line electrically connected to the pad;
an external well of a first conductivity type in the ESD region of the substrate;
an internal well of a second conductivity type in the external well, the first conductivity type opposite the second conductivity type;
a first heavily doped region of the first conductivity type located at a surface of the internal well;
a second heavily doped region of the second conductivity type located at a surface of the internal well;
a third heavily doped region of the first conductivity type located at a surface of the external well;
wherein the second heavily doped region is interposed between and spaced from each of the first and third heavily doped regions, and
wherein the apparatus is devoid of electrical isolation material between the first and second heavily doped regions or the apparatus is devoid of electrical isolation material between the second and third heavily doped regions or the apparatus is devoid of electrical isolation material between the first and second heavily doped regions and between the second and third heavily doped regions; and
electrically conductive wiring electrically connecting the first heavily doped region to the pad,
the third heavily doped region to the pad, and
the second heavily doped region to one of a ground potential and a voltage source.

13. The electronic apparatus of claim 12, wherein the apparatus is devoid of electrical isolation material between the first and second heavily doped regions and between the second and third heavily doped regions.

14. The electronic apparatus of claim 12, further comprising first, second and third metal electrodes electrically connected to the first, second and third heavily doped regions, respectively, and wherein the electrically conductive wiring is electrically connected to the electrodes.

15. The electronic apparatus of claim 13, wherein the first conductivity type is N-type and the second conductivity type is P-type, and wherein the electrically conductive wiring extends between the second metal electrode and a ground potential, and between the pad and the first and third metal electrodes.

16. The electronic apparatus of claim 14, wherein the first conductivity type is P-type and the second conductivity type is N-type, and wherein the electrically conductive wiring extends between the second metal electrode and a voltage source, and between the pad and the first and third metal electrodes.

17. The electronic apparatus of claim 12, wherein the second heavily doped region surrounds the first heavily doped region, and the third heavily doped region surrounds the second heavily doped region.

18. The electronic apparatus of claim 12, further comprising a device isolation structure of electrical isolation material located in the substrate and extending along a boundary between the external well and a portion of the substrate outside the external well.

19. The electronic apparatus of claim 12, wherein the electrical device is a complementary metal oxide CMOS device.

* * * * *